United States Patent [19]

Muschke

[11] Patent Number: 4,904,617
[45] Date of Patent: Feb. 27, 1990

[54] METHOD FOR SEPARATING MONOLITHICALLY PRODUCED LASER DIODES

[75] Inventor: Markus Muschke, Brunnthal, Fed. Rep. of Germany

[73] Assignee: Siemens Aktiengesellschaft, Berlin and Munich, Fed. Rep. of Germany

[21] Appl. No.: 236,476

[22] Filed: Aug. 25, 1988

[30] Foreign Application Priority Data

Sep. 17, 1987 [DE] Fed. Rep. of Germany ....... 3731312

[51] Int. Cl.⁴ .................. H01L 21/20; H01L 21/302
[52] U.S. Cl. .......................... 437/129; 148/DIG. 51; 148/DIG. 95; 148/DIG. 131; 156/649; 156/661.1; 437/66; 437/226; 437/229; 437/905; 357/17; 357/56
[58] Field of Search .............. 148/DIG. 5, 56, 65, 148/72, 95, 111, 119, 131, 168; 156/643, 644, 649, 661.1, 662; 437/48, 51, 68, 65, 66, 126, 129, 225, 226, 229, 905, 906; 357/17, 55, 56

[56] References Cited

U.S. PATENT DOCUMENTS

| 3,996,492 | 12/1976 | McGroddy | 437/228 |
| 3,996,528 | 12/1976 | Blum et al. | 372/44 |
| 4,236,296 | 12/1980 | Woolhouse et al. | 437/226 |
| 4,237,601 | 12/1980 | Woolhouse et al. | 437/226 |
| 4,354,898 | 10/1982 | Coldren et al. | 437/225 |
| 4,355,457 | 10/1982 | Barlett et al. | 437/226 |
| 4,674,096 | 6/1987 | Salzman et al. | 372/50 |
| 4,729,971 | 3/1988 | Coleman | 437/226 |

FOREIGN PATENT DOCUMENTS

| 0205291 | 12/1983 | Fed. Rep. of Germany | 437/226 |
| 58-220446 | 12/1983 | Japan | . |
| 0126678 | 7/1984 | Japan | 437/226 |
| 0219975 | 12/1984 | Japan | 437/226 |

OTHER PUBLICATIONS

Coldren et al., "Monolithic... Active-Optical-Resonator Devices, Formed by Reactive Ion Ething," Appl. Phys. Lett., 38(5), 1 Mar. 1981, pp. 315–317.
Burton et al., "Plasma Separation of INGaAsP/InP Light-Emitting Diodes," Appl. Phys. Lett., 37(4), 15 Aug. 1980, pp. 411–412.
Journal of Applied Physics, vol. 57, No. 8, Apr. 15, 1985, pp. 2948–2950; J. Salzman et al.
Journal of the Electrochemical Society, vol. 128, No. 6, Jun. 1981, pp. 1342–1349, Adachi et al.

Primary Examiner—Brian E. Hearn
Assistant Examiner—William Bunch
Attorney, Agent, or Firm—John Francis Moran

[57] ABSTRACT

A method for separating laser diodes. The diodes are monolithically produced from a semiconductor substrate wafer which through an epitaxy process has been provided with a layer sequence suitable for laser operation. First, the semiconductor substrate wafer is covered with a first mask which defines the interspaces between the mirrors of adjacent laser diodes. Then the mirror surfaces are etched out of the semiconductor substrate wafer. Thereafter, the wafer is covered with a second mask for defining separation trench areas between the mirror surfaces of adjacent laser diodes and for protecting the remaining wafer parts. Then, separation are etched into the trench area. Finally, the laser diodes are separated by breaking the wafer along the trenches. In a preferred embodiment, the wafer thickness is at most twice the distance between the mirror surfaces of adjacent laser diodes and the trench depth is at least one fourth of the wafer thickness.

11 Claims, 1 Drawing Sheet

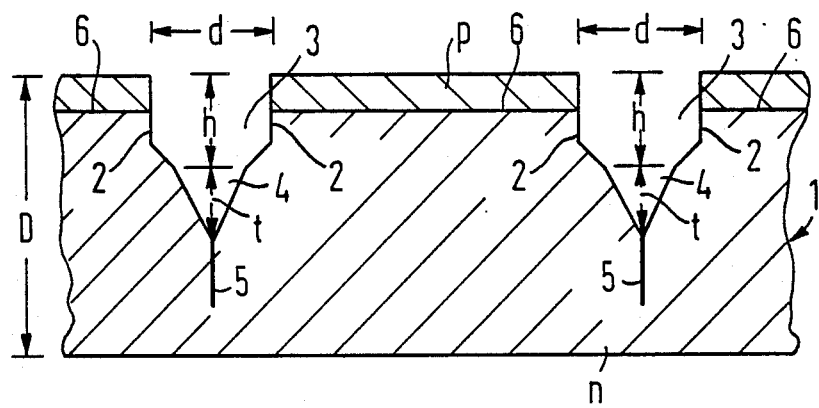

METHOD FOR SEPARATING MONOLITHICALLY PRODUCED LASER DIODES

BACKGROUND OF THE INVENTION

The invention relates to a method for separating monolithically produced laser diodes. It relates, in particular, to a method for separating laser diodes having mirror surfaces etched out of a semiconductor substrate wafer.

Semiconductor components can only be produced efficiently if a large number of chips can be prepared on a semiconductor substrate wafer. In the case of laser diodes for light waveguides this means that all technology-oriented steps are performed on the wafer, including the complex production of the laser mirrors. It has recently become possible to produce the laser mirrors on the wafer; this is done by means of so-called physical or physical-chemical dry etching processes. This manufacturing method is known under the generic term "monolithic laser technology".

For manufacturing the laser mirror the semiconductor surface to be protected is coated with a photoresist of the desired geometric structure. Through the process of dry etching the desired mirror, structure is subsequently obtained on the wafer. In the dry etching process, an interspace of predetermined width and depth is etched into the semiconductor. Portions of the interspace walls represent the laser mirrors. The mirror height must meet the minimum requirement that the light can emerge unhindered from the laser diode. The interspace width between the mirrors of adjacent diodes can vary. At this stage of the manufacturing process, the p-contacts of the semiconductor diodes are already formed. To complete the process, one must break the wafer into separate chips and produce the n-contacts.

When conventional separation methods are used, the following problems occur: if separation is attempted by scribing the wafer with a diamond, for example from the p-side, then the mirrors get damaged, if the mirror distance d is small ($d \approx 10$ $\mu$m). If the wafer is scribed from the reverse side with d being small, the yield will be poor due to adjustment inaccuracies and fracture dislocations which can cause the finished laser mirrors to get separated from the diodes.

The same problems are encountered, if the wafer is only slightly scribed and then split. In all cases, the yield is modest. On the other hand, however, the light cone, which emerges from the laser diode with an angular aperture of approximately 60°, can hardly be disturbed by a projecting fracture edge.

According to another alternative, technique the distance between mirrors of adjacent laser diodes is made very large ($d > 50$ $\mu$m) so that scribing and breaking from the p-side as well as from the n-side proceeds without any problem. The disadvantage in this case is, however, that the light cone emerging from the laser diode is usually disturbed by reflections at the fracture edge. As a result, the far field is normally so distorted that the light cannot be coupled into a glass fiber in a defined manner and thus, the laser diode cannot be used as a light waveguide element.

It is an object of this invention to provide a method for separating monolithically produced laser diodes which avoids far-field-distorting fracture edges.

It is another object of this invention to provide a method for separating monolithically produced laser diodes which includes only a few steps and is relatively simple.

It is a further object of this invention to provide a method for separating monolithically produced laser diodes which renders high yields.

It is still a further object of this invention to provide a method which improves over existing processes to separate laser diodes.

SUMMARY OF THE INVENTION

The invention is directed to a method for separating laser diodes which have mirror surfaces and are monolithically produced out of a semiconductor substrate wafer which has been provided with a sequence of epitaxially deposited layers suitable for laser operation. The method comprises the following steps: First, the semiconductor substrate wafer is masked with a first mask for defining the structure of the mirror surfaces. Then, the mirror surfaces are etched from the semiconductor substrate wafer. The first mask is then removed afterwards, the semiconductor substrate wafer is masked with a second mask for defining separation trench areas between the mirror surfaces of adjacent laser diodes. Then, separation trenches are etched from the separation trench areas. Finally, the laser diodes are separated by breaking the semiconductor substrate wafer along the separation trenches.

According to one aspect of the invention, the separation trenches are etched with a liquid chemical agent, in particular, a 3:1:1 solution comprised of $3H_2SO_4:1H_2O_2:1H_2O$.

According to another aspect of the invention the separation trenches are etched with a dry etching agent, in particular, a chloride plasma.

According to the preferred embodiment of the invention, the semiconductor substrate wafer may, after etching the separation trenches, be further weakened along these trenches by scratching the wafer from one of its two sides, by trench etching or by sawing the wafer from its side opposite the separation trenches. (Whether these additional steps are necessary depends on the wafer thickness and/or the depth of the separation trenches.) Good results are normally obtained without any further weakening, if the wafer thickness D is smaller than, or equal to, twice the distance d between mirror surfaces of adjacent laser diodes (a typical example: $D = 80$ $\mu$m, $d \geq 40$ $\mu$m). The depth t of the separation trenches is not so critical, but should be at least one fourth of the wafer thickness D; this ratio can be obtained without difficulties.

The method according to the present invention insures a clean fracture along the separation trenches. Of importance and of particular advantage is that a far-field-distorting fracture edge is absent.

The foregoing and other objects, features and advantages of the invention will be apparent from the following more particular description of a preferred embodiment of the invention, as illustrated in the accompanying sole Figure.

DETAILED DESCRIPTION OF A PREFERRED EMBODIMENT

The sole Figure is a schematic cross-section of a n-conducting semiconductor substrate wafer 1 having an upper p-side which adjoins on the n-side from above and is indicated by the letter p. From the surface of wafer 1 which has an overall thickness D, mirror interspaces 3 are etched by a dry etching process. The etching is carried out with a first mask for defining the desired structure. Interspaces 3 are bordered by mirror surfaces 2 of laser diodes 6. They have a width d and a depth h. After etching the mirror surfaces 2 from the semiconductor substrate 1, the wafer parts to be protected which includes the mirror surface 2 are provided with a second mask, for example a photoresist coating. Subsequently, separation trenches 4 having a depth t are etched into the mirror interspaces 3 between the laser diodes 6. This etch may be done with a liquid agent or by a dry etching agent, in the present embodiment the thickness D of wafer 1 is about twice the width d of the interspaces 3. Finally, the individual laser diodes 6 are separated by breaking wafer 1 along fracture lines 5 at the bottom of separation trenches 4.

Having thus described the invention with particular reference to a preferred form thereof, it will be obvious to those skilled in the art to which the invention pertains, after understanding the invention, that various changes and modifications may be made therein without departing from the spirit and scope of the invention as defined by the claims appended hereto.

I claim:

1. A method for separating laser diodes that are produced monolithically on a first major surface on a semiconductor substrate wafer which has a sequence of epitaxially deposited layers on the first major surface suitable for laser operation, said method comprising the following steps:
   (a) masking the first major surface of the semiconductor substrate wafer including the deposited layers with a first mask for defining mirror surfaces for the laser diodes,
   (b) etching the mirror surfaces out of the semiconductor substrate wafer,
   (c) removing said first mask,
   (d) masking the semiconductor substrate wafer including said mirror surfaces with a second mask for defining separation trench areas between the mirror surfaces of adjacent laser diodes,
   (e) etching separation trenches out of the separation trench areas, and
   (f) separating the laser diodes by breaking the semiconductor substrate wafer along the separation trenches.

2. A method according to claim 1, wherein step (e) is carried out with a liquid etching agent.

3. A method according to claim 2, wherein the liquid etching agent is a 3:1:1 solution comprised of $3H_2SO_4:1H_2O_2:1H_2O$.

4. A method according to claim 1, wherein step (e) is carried out with a dry etching agent.

5. A method according to claim 4, wherein the dry etching agent is chlorine plasma.

6. A method according to claim 1, wherein in an additional step between steps (e) and (b) the semiconductor substrate wafer is further weakened along the separation trenches.

7. A method according to claim 6, wherein the additional step is carried out by scribing the semiconductor substrate wafer.

8. A method according to claim 6, wherein the additional step is carried out by trench etching the semiconductor substrate wafer.

9. A method according to claim 6, wherein the additional step is carried out by sawing the semiconductor substrate wafer.

10. A method according to claim 1, wherein the mirror surfaces of adjacent laser diodes are separated by a distance d and the semiconductor substrate wafer has a thickness D which is at most twice the distance d.

11. A method according to claim 1, wherein the semiconductor substrate wafer has a thickness D and the separation trenches have a depth t which is at least one fourth of the thickness D.

* * * * *